(12) United States Patent
Tran

(10) Patent No.: US 7,341,901 B2
(45) Date of Patent: *Mar. 11, 2008

(54) SEMICONDUCTOR PROCESSING METHODS OF FORMING INTEGRATED CIRCUITRY

(75) Inventor: Luan C. Tran, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 886 days.

This patent is subject to a terminal disclaimer.

(21) Appl. No.: 09/848,846

(22) Filed: May 3, 2001

(65) Prior Publication Data

US 2001/0018251 A1    Aug. 30, 2001

Related U.S. Application Data

(62) Division of application No. 09/388,856, filed on Sep. 1, 1999, now Pat. No. 6,579,751.

(51) Int. Cl.
*H01L 21/00* (2006.01)
(52) U.S. Cl. .................... 438/194; 438/197
(58) Field of Classification Search ............... 438/241, 438/275, 231, 306, 199, 303, 194, 240, 232, 438/233, 300, 301, 302, 285, 166, 308, 289, 438/217, 286, 291, 197; 257/306, 369, 370, 257/371
See application file for complete search history.

(56) References Cited

U.S. PATENT DOCUMENTS 4,612,629 A    9/1986 Harari (Continued)

FOREIGN PATENT DOCUMENTS

EP    0 717 448 A1    6/1996

(Continued)

OTHER PUBLICATIONS

Silicon Processing for the VLSI Era, vol. III; "Punchthrough (Subsurface-DIBL) in Short-Channel MOSFETs"; undated; pp. 232-235, 238-244.

(Continued)

*Primary Examiner*—Laura M. Schillinger
(74) *Attorney, Agent, or Firm*—Wells St. John, P.S.

(57) ABSTRACT

Semiconductor processing methods of forming integrated circuitry are described. In one embodiment, memory circuitry and peripheral circuitry are formed over a substrate. The peripheral circuitry comprises first and second type MOS transistors. Second type halo implants are conducted into the first type MOS transistors in less than all of the peripheral MOS transistors of the first type. In another embodiment, a plurality of n-type transistor devices are formed over a substrate and comprise memory array circuitry and peripheral circuitry. At least some of the individual peripheral circuitry n-type transistor devices are partially masked, and a halo implant is conducted for unmasked portions of the partially masked peripheral circuitry n-type transistor devices. In yet another embodiment, at least a portion of only one of the source and drain regions is masked, and at least a portion of the other of the source and drains regions is exposed for at least some of the peripheral circuitry n-type transistor devices. A halo implant is conducted relative to the exposed portions of the source and drain regions. In another embodiment, a common masking step is used and a halo implant is conducted of devices formed over a substrate comprising memory circuitry and peripheral circuitry sufficient to impart to at least three of the devices three different respective threshold voltages.

3 Claims, 4 Drawing Sheets

U.S. PATENT DOCUMENTS

| | | | |
|---|---|---|---|
| 4,785,342 A | | 11/1988 | Yamanaka et al. |
| 5,252,504 A * | | 10/1993 | Lowrey et al. ............. 438/210 |
| 5,272,367 A * | | 12/1993 | Dennison et al. .......... 257/306 |
| 5,371,026 A | | 12/1994 | Hayden et al. ............... 437/41 |
| 5,534,449 A * | | 7/1996 | Dennison et al. .......... 438/231 |
| 5,661,054 A | | 8/1997 | Kauffman et al. .......... 438/257 |
| 5,683,927 A * | | 11/1997 | Dennison et al. .......... 438/231 |
| 5,736,444 A | | 4/1998 | Kauffman et al. .......... 438/257 |
| 5,747,855 A * | | 5/1998 | Dennison et al. .......... 257/369 |
| 5,773,863 A | | 6/1998 | Burr et al. |
| 5,776,806 A * | | 7/1998 | Dennison et al. .......... 438/199 |
| 5,786,249 A * | | 7/1998 | Dennison .................... 438/241 |
| 5,834,851 A | | 11/1998 | Ikeda et al. ................. 257/903 |
| 6,004,854 A * | | 12/1999 | Dennison et al. .......... 438/306 |
| 6,008,080 A | | 12/1999 | Chuang et al. ............. 438/200 |
| 6,054,730 A | | 4/2000 | Noguchi ..................... 257/306 |
| 6,074,924 A * | | 6/2000 | Dennison et al. .......... 438/306 |
| 6,124,616 A * | | 9/2000 | Dennison et al. .......... 257/369 |
| 6,200,863 B1 | | 3/2001 | Xiang et al. ................ 438/286 |
| 6,238,967 B1 | | 5/2001 | Shiho et al. ................ 438/244 |
| 6,261,888 B1 | | 7/2001 | Dennison et al. .......... 438/231 |
| 6,312,997 B1 * | | 11/2001 | Tran ........................... 438/303 |
| 6,337,250 B2 | | 1/2002 | Furuhata .................... 438/301 |
| 6,358,787 B2 | | 3/2002 | Dennison et al. ............ 438/231 |
| 6,423,620 B2 | | 7/2002 | Pan et al. .................... 438/597 |
| 6,455,362 B1 * | | 9/2002 | Tran et al. ................... 438/194 |
| 6,466,489 B1 | | 10/2002 | Ieong et al. ........... 365/189.09 |
| 6,545,904 B2 * | | 4/2003 | Tran ........................... 365/149 |
| 6,579,751 B2 | | 6/2003 | Tran ........................... 438/194 |
| 6,580,149 B2 * | | 6/2003 | Tran et al. ................... 257/549 |
| 6,620,679 B1 | | 9/2003 | Tzeng et al. ................. 438/250 |
| 6,759,288 B2 * | | 7/2004 | Tran et al. ................... 438/194 |
| 6,803,278 B2 * | | 10/2004 | Tran ........................... 438/258 |
| 2003/0036235 A1* | | 2/2003 | Tran ........................... 438/275 |
| 2003/0153138 A1* | | 8/2003 | Tran ........................... 438/197 |
| 2003/0205745 A1 | | 11/2003 | Nam ........................... 257/296 |

FOREIGN PATENT DOCUMENTS

WO     WO 98/29897     7/1998

OTHER PUBLICATIONS

S. J. Ahn et al., "Novel DRAM Cell Transistor with Asymmetric Source and Drain Junction Profiles Improving Data Retention Characteristics" IEEE, 2002, pp. 176-177.

* cited by examiner

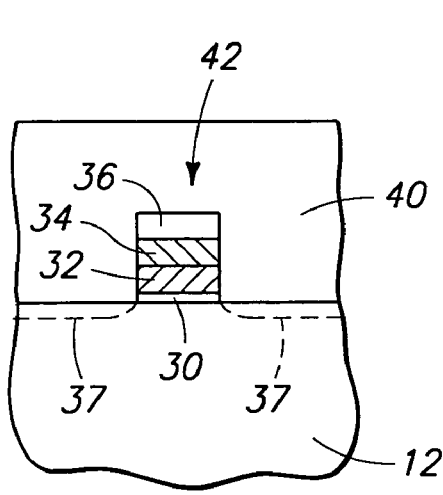
$\overline{\underline{F}I\underline{G}}$ 2
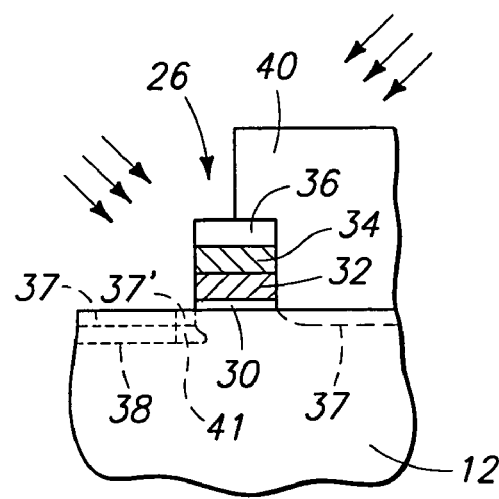
$\overline{\underline{F}I\underline{G}}$ 3
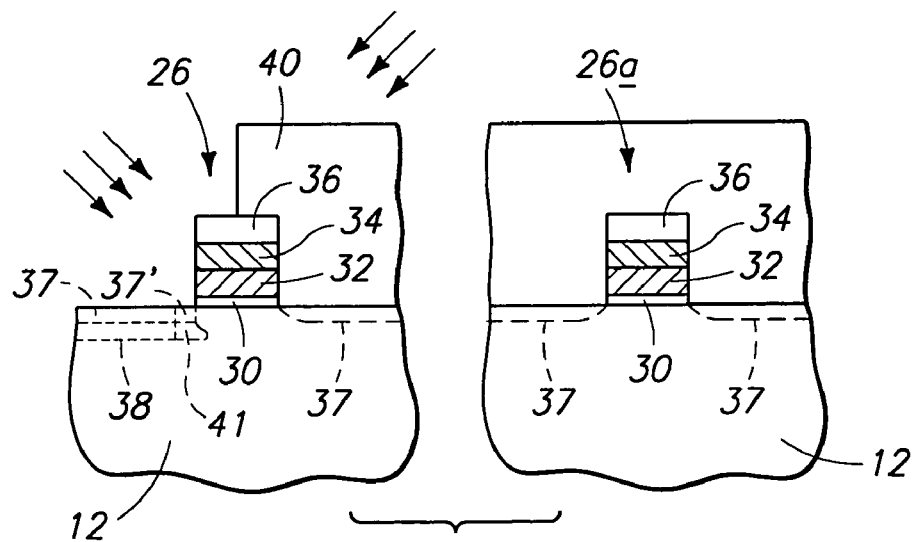
$\overline{\underline{F}I\underline{G}}$ 4

SEMICONDUCTOR PROCESSING METHODS OF FORMING INTEGRATED CIRCUITRY

CROSS REFERENCE TO RELATED APPLICATION

This patent application is a Divisional Application of U.S. patent application Ser. No. 09/388,856, filed on Sep. 1, 1999 now U.S. Pat. No. 6,579,751, entitled "Semiconductor Processing Methods of Forming Integrated Circuitry" and naming Luan C. Tran as inventor.

TECHNICAL FIELD

This invention relates generally to semiconductor processing methods of forming integrated circuitry, and particularly to methods of forming integrated circuit devices having different threshold voltages.

BACKGROUND OF THE INVENTION

Field effect transistors are characterized by a source region, a drain region and a gate. The source and drain regions are typically received within a semiconductive material, such as a semiconductive substrate. The gate is typically disposed elevationally over the source and drain regions. A gate voltage of sufficient minimum magnitude can be placed on the gate to induce a channel region underneath the gate and between the source and drain regions. Such channel-inducing voltage is typically referred to as the transistor's threshold voltage, or $V_t$. Accordingly, the threshold voltage turns the transistor on. Once the magnitude of the threshold voltage has been exceeded, current can flow between the source and drain regions in accordance with a voltage called the source/drain voltage, or $V_{ds}$.

Threshold voltage magnitudes can be affected by channel implants. Specifically, during fabrication of semiconductor devices, a substrate can be implanted with certain types of impurity to modify or change the threshold voltage of a resultant device. Such channel implants can also affect a condition known as subsurface punchthrough. Punchthrough is a phenomenon which is associated with a merging of the source and drain depletion regions within a MOSFET. Specifically, as the channel gets shorter (as device dimensions get smaller), depletion region edges get closer together. When the channel length is decreased to roughly the sum of the two junction depletion widths, punchthrough is established. Punchthrough is an undesired effect in MOSFETS.

One way of addressing punchthrough in sub-micron devices is through provision of a so-called halo implant, also known as a "pocket" implant. Halo implants are formed by implanting dopants (opposite in type to that of the source and drain) within the substrate proximate the source and drain regions, and are typically disposed underneath the channel region. The implanted halo dopant raises the doping concentration only on the inside walls of the source/drain junctions, so that the channel length can be decreased without needing to use a higher doped substrate. That is, punchthrough does not set in until a shorter channel length because of the halo.

It is desirable to have MOSFETS with different threshold voltages depending upon the context in which the integrated circuitry of which they comprise a part is to be used. In the context of memory devices it can be beneficial to have transistors with different threshold voltages.

This invention arose out of concerns associated with improving the methods through which integrated circuits are fabricated. In particular, the invention arose concerns associated with providing improved methods of forming memory devices.

SUMMARY OF THE INVENTION

Semiconductor processing methods of forming integrated circuitry are described. In one embodiment, memory circuitry and peripheral circuitry are formed over a substrate. The peripheral circuitry comprises first and second type MOS transistors. Second type halo implants are conducted into the first type MOS transistors in less than all of the peripheral MOS transistors of the first type. In another embodiment, a plurality of n-type transistor devices are formed over a substrate and comprise memory array circuitry and peripheral circuitry. At least some of the individual peripheral circuitry n-type transistor devices are partially masked, and a halo implant is conducted for unmasked portions of the partially masked peripheral circuitry n-type transistor devices. In yet another embodiment, at least a portion of only one of the source and drain regions is masked, and at least a portion of the other of the source and drains regions is exposed for at least some of the peripheral circuitry n-type transistor devices. A halo implant is conducted relative to the exposed portions of the source and drain regions. In another embodiment, a common masking step is used and a halo implant is conducted of devices formed over a substrate comprising memory circuitry and peripheral circuitry sufficient to impart to at least three of the devices three different respective threshold voltages.

BRIEF DESCRIPTION OF THE DRAWINGS

Preferred embodiments of the invention are described below with reference to the following accompanying drawings.

FIG. 2 is a side sectional view of a semiconductor wafer fragment in process in accordance with one embodiment of the invention.

FIG. 3 is a side sectional view of a semiconductor wafer fragment in process in accordance with one embodiment of the invention.

FIG. 4 is a side sectional view of a semiconductor wafer fragment in process in accordance with one embodiment of the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
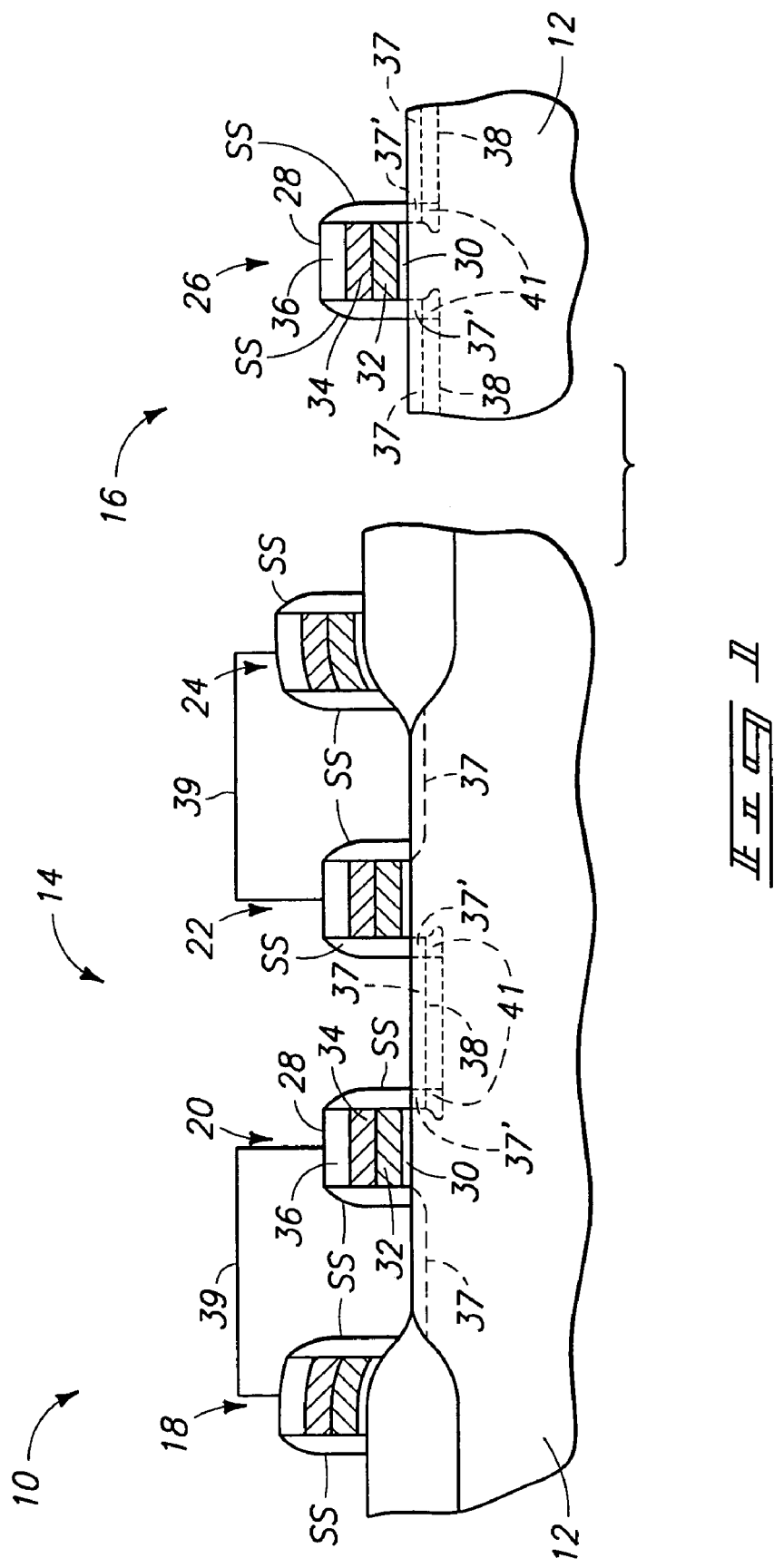
FIG. 1 is a diagrammatic side sectional view of a semiconductor wafer fragment in process, which is suitable for use in connection with one or more embodiments of the present invention.

Referring to FIG. 1, a semiconductor wafer fragment in process is shown generally at 10 and includes a semiconductive substrate 12. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Memory array circuitry 14 and peripheral circuitry 16 are formed over substrate 12. Memory circuitry 14 comprises individual transistors 20, 22. Peripheral circuitry 16 comprises a transistor 26. These transistors are shown for example only. Each exemplary transistor will typically include a conductive gate line 28 (designated for transistors and 26 only) having a gate oxide layer 30, a polysilicon layer 32, a silicide layer 34, and an overlying insulative cap 36. Conventional sidewall spacers SS are optionally provided over the sidewalls of gate line 28. Of course, other gate line constructions could be used. Source/drain regions 37 and 38 are provided within substrate 12.

The drain regions 37 may be formed in several different ways. In one embodiment, the drain regions 37 are doped first with a blanket n-minus implant, which may be performed before or after formation of the sidewalls SS. As used herein, the term "blanket implant" refers to an implant process that does not employ a masking step. In one embodiment, the drain regions 37 are doped by out-diffusion of dopants from a doped polysilicon layer forming a portion of a storage node 39.

The source regions 38 may also be formed in several different ways. In one embodiment, the source regions are doped first with a blanket n-minus implant 37' and then with a n-plus implant, followed by a halo implant 41.

Typically, the transistors forming peripheral circuitry 16 will include first- and second-type MOS transistors. For example and for purposes of the on-going discussion, first-type MOS transistors will comprise n-type transistors, and second-type MOS transistors will comprise p-type transistors. Similarly, in this example, implants comprising a second-type of material will comprise p-type implants such as boron.

Referring to FIGS. 2 and 3, a masking layer 40 is formed over substrate 12. Transistor 42 (FIG. 2) can constitute a transistor which is disposed within the memory array, or one which is disposed within the peripheral area. Similarly, transistor 26 (FIG. 3) can constitute a transistor which is disposed within the memory array, or one which is disposed within the peripheral area. Transistor 26 can represent one of many similar partially-masked transistors in either the peripheral area or the memory array. In one embodiment, and with masking layer 40 in place, a second-type halo implant is conducted into transistor 26 and in less than all transistors of the first type. The halo implant forms a halo region 41 received within substrate 12. In this case, transistor 42 can constitute a transistor which does not receive the halo implant. In one embodiment, when transistors receive the halo implant, only one side of the transistor receives the implant, such as shown in FIG. 3. This constitutes a different transistor having a different threshold voltage $V_t$ than those transistors not receiving the halo implant.

Specifically, in one embodiment, transistor 26 comprises an n-type transistor device which is partially masked, and the halo implant is conducted for unmasked portions of the transistor or transistors. Various portions of transistor 26 can be masked to result in a partially masked transistor. For example, at least a portion of one of the source and drain regions can be masked, and at least a portion of the other of the source and drain regions can be exposed. As a further example, a majority portion of one of the drain regions can be masked, while a majority portion of the other of the source regions is not masked for at least some of the devices. In the illustrated example, an entirety of one of the drain regions is masked, and the entirety of the other of the source regions is not masked. Where a transistor's source region is masked, after the halo implantation, the transistor will have a configuration similar to a source follower configuration. Where a transistor's drain region is masked, after the halo implantation, the transistor can have its electric field suppressed proximate the drain.

In another embodiment, the second-type halo implants are conducted into only one of the source and drain regions in less than all of the MOS transistors of the first type, and not the other of the source and drain regions of those peripheral MOS transistors of the first type.

Referring to FIG. 4, another embodiment of the invention is shown. Leftmost transistor 26 can comprise any of the partially-masked configurations described with respect to FIG. 3. Rightmost transistor 26a has both source and drain regions masked, and constitutes other n-type transistor devices which do not receive a halo implant. As a result, the rightmost transistor 26a has a lower threshold voltage $V_t$ than transistors receiving the halo implant.

Figure 5:
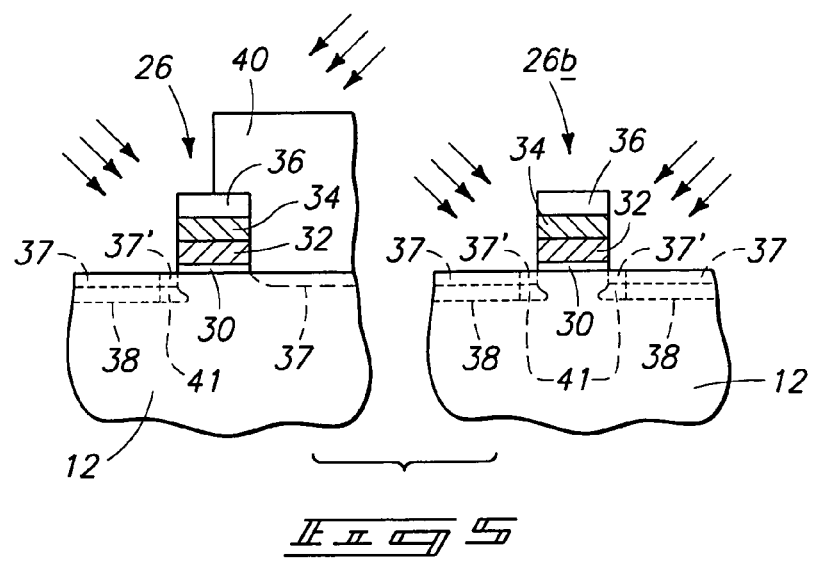
FIG. 5 is a side sectional view of a semiconductor wafer fragment in process in accordance with one embodiment of the invention.

Referring to FIG. 5, another embodiment of the invention is shown. Leftmost transistor 26 can comprise any of the partially-masked configurations described with respect to FIG. 3. Transistor 26b has both of its source and drain regions left exposed during the halo implant. Accordingly, halo regions 41 are formed proximate the source/drain regions of transistor 26b.

Figure 6:
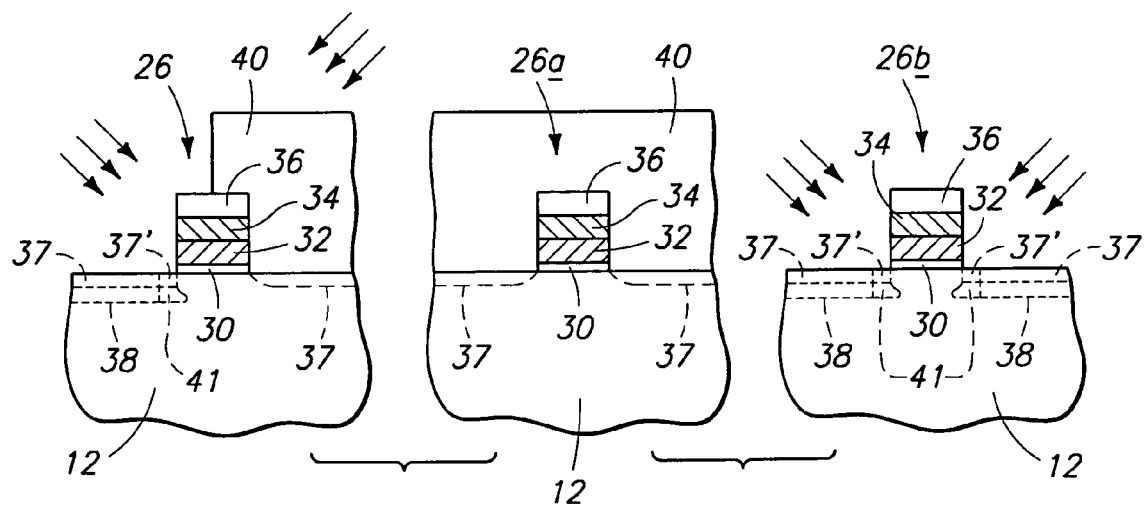
FIG. 6 is a side sectional view of a semiconductor wafer fragment in process in accordance with one embodiment of the invention.

Referring to FIG. 6, another embodiment of the invention is shown. Leftmost transistor 26 can comprise any of the partially-masked configurations described with respect to FIG. 3. In this embodiment, portions of transistors in either the peripheral or the memory array region are partially masked, and, in addition, the source regions and drain regions for some other individual transistor devices are masked, e.g. transistor 26a, while different other individual peripheral transistor devices, e.g. transistor 26b, have their source regions and drain regions exposed during the halo implant. Accordingly, where both of the source and drain regions are exposed, a pair of halo regions 41 is formed. These associated transistor devices having both source and drain regions exposed are, for purposes of this document, referred to as first transistor devices. Where both of the source and drain regions are masked or otherwise blocked, no halo regions are formed. These associated transistor devices having both source and drain regions masked or blocked are, for purposes of this document, referred to as second transistor devices. Where a portion of a transistor device is exposed, a halo region can, in some instances, be formed with respect to only one of the source and drain regions. These associated transistor devices are, for purposes of this document, referred to as third transistor devices. Preferably, these associated transistor devices are all NMOS transistor devices.

Alternately considered, and in a preferred embodiment, a common masking step is utilized and in a common implant step, a halo implant is conducted of devices formed over a substrate comprising memory circuitry and peripheral circuitry, sufficient to impart to at least three of the devices three different respective threshold voltages. In one embodiment, the three devices comprise NMOS field effect transistors.

In the context of NMOS field effect transistors in which the implanted halo impurity comprises a p-type impurity, those transistors whose source and drain regions are fully exposed, will typically have the highest threshold voltage $V_{t1}$. Those transistors which are partially masked during the halo implant will typically have a threshold voltage $V_{t2}$ which is somewhat lower than threshold voltage $V_{t1}$. Those transistors whose source and drain regions are completely blocked during the halo implant will typically have the lowest threshold voltage $V_{t3}$ of the threshold voltages. Accordingly, three different threshold voltages are provided through one common masking step.

Figure 7:
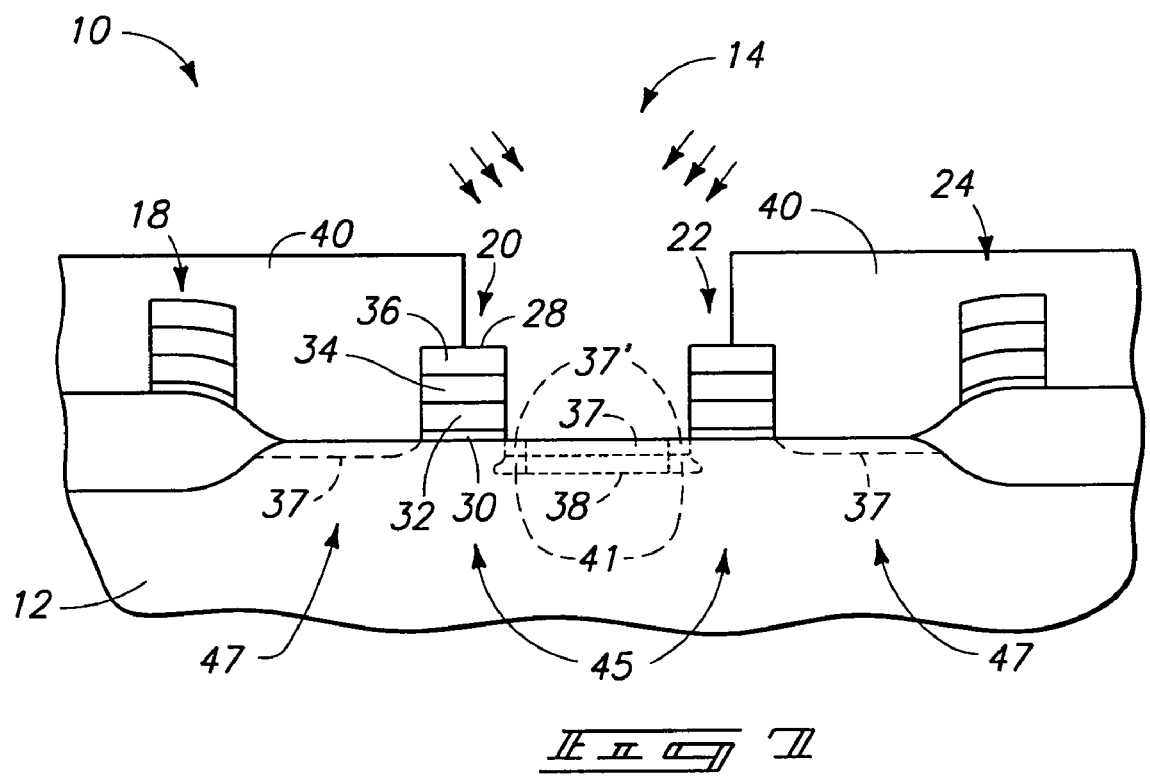
FIG. 7 is a side sectional view of a semiconductor wafer fragment in process in accordance with one embodiment of the invention.

FIG. 7 is a side sectional view of a semiconductor wafer fragment in process in accordance with one embodiment of the invention. Transistors 20 and 22 of FIG. 1 now form memory access transistors 45 having a threshold voltage that corresponds to a single halo implant 41 on a bitline contact side of the access transistors 45. Storage node sides 47 of the access transistors 45 are masked by the masking layer to prevent boron from being implanted. Forming access transistors 45 in this way improves refresh capabilities. The one-sided halo implant 41 in the access transistors 45 allows the channel doping to be reduced while maintaining the same threshold voltage $V_t$ and subthreshold voltage. The lower channel doping, in turn, gives rise to improved DRAM refresh characteristics, because charge leakage from the storage nodes 47 is reduced.

It will be appreciated that the halo implant and the mask 40 therefor may be effectuated before formation of sidewall spacers (denoted "SS" in FIG. 1), as shown in FIGS. 2-7, or after formation of sidewall spacers (as shown in FIG. 1). The sidewall spacers SS shown in FIG. 1 may be formed using conventional deposition, oxidation and/or etching techniques. It will be appreciated that when boron is implanted into a n-type device, n-well bias plugs and other conventional features should be masked to avoid compromise of the conductivity of these features.

When the halo implant is done with a mask, prior to formation of sidewall spacers SS, it is normally accompanied by an n-minus implant 37, using either phosphorous or arsenic. When the halo implant is done after formation of the sidewall spacers SS, it is assumed that the n-minus layer 37 was formed earlier as part of a LDD (lightly doped drain) structure. This same halo implant is normally accompanied by an n+ source drain implantation.

One preferred application for such devices can be in the context of peripheral circuitry comprising a so-called equilibrating device, which is typically connected between bit lines D and D* in dynamic random access memory circuitry in order to bring the bit lines to a common voltage potential (typically $V_{cc}/2$) prior to firing the word lines to perform a sensing operation. Another application can be for the cross-coupled transistors in a sense amplifier circuit, where lower threshold voltage $V_t$ is preferred for better margin and refresh properties. Other applications can include various low-voltage applications which will be apparent to the skilled artisan.

In compliance with the statute, the invention has been described in language more or less specific as to structural and methodical features. It is to be understood, however, that the invention is not limited to the specific features shown and described, since the means herein disclosed comprise preferred forms of putting the invention info effect. The invention is, therefore, claimed in any of its forms or modifications within the proper scope of the appended claims appropriately interpreted in accordance with the doctrine of equivalents.

The invention claimed is:

1. A semiconductor processing method comprising:
a masking step providing a common mask; and
an implant step carried out through the common mask, comprising conducting a halo implant of devices formed over a substrate comprising memory circuitry and peripheral circuitry sufficient to impart to at least three of the devices three different respective threshold voltages, wherein the common masking step comprises masking only portions of some of the devices which receive the halo implant, said portions comprising portions of peripheral circuitry devices.

2. A semiconductor processing method comprising:
a masking step providing a common mask; and
an implant step carried out through the common mask, comprising conducting a halo implant of devices formed over a substrate comprising memory circuitry and peripheral circuitry sufficient to impart to at least three of the devices three different respective threshold voltages, wherein the common masking step comprises masking only portions of some of the devices which receive the halo implant; said devices which receive the halo implant comprise NMOS field effect transistors; and said portions comprise portions of peripheral circuitry devices.

3. A semiconductor processing method comprising:
a masking step providing a common mask; and
an implant step carried out through the common mask, comprising conducting a halo implant of devices formed over a substrate comprising memory circuitry and peripheral circuitry sufficient to impart to at least three of the devices three different respective threshold voltages, wherein the common masking step comprises masking only portions of some of the devices which receive the halo implant; said devices which receive the halo implant comprise PMOS field effect transistors; and said portions comprise portions of peripheral circuitry devices.

* * * * *